(12) United States Patent
Ohta et al.

(10) Patent No.: US 11,944,999 B2
(45) Date of Patent: Apr. 2, 2024

(54) VIBRATION DEVICE AND PIEZOELECTRIC ELEMENT

(71) Applicant: TDK CORPORATION, Tokyo (JP)

(72) Inventors: Yoshiki Ohta, Tokyo (JP); Hideya Sakamoto, Tokyo (JP); Kazushi Tachimoto, Tokyo (JP); Yoshikazu Shimura, Tokyo (JP); Tetsuyuki Taniguchi, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 787 days.

(21) Appl. No.: 16/977,122

(22) PCT Filed: Feb. 21, 2019

(86) PCT No.: PCT/JP2019/006628
§ 371 (c)(1),
(2) Date: Sep. 1, 2020

(87) PCT Pub. No.: WO2019/167805
PCT Pub. Date: Sep. 6, 2019

(65) Prior Publication Data
US 2020/0406297 A1 Dec. 31, 2020

(30) Foreign Application Priority Data
Mar. 2, 2018 (JP) .................. 2018-037596

(51) Int. Cl.
*H01L 41/047* (2006.01)
*B06B 1/06* (2006.01)
(Continued)

(52) U.S. Cl.
CPC ....... *B06B 1/0603* (2013.01); *H10N 30/2047* (2023.02); *H10N 30/50* (2023.02);
(Continued)

(58) Field of Classification Search
CPC .. B06B 1/0603; H10N 30/2047; H10N 30/50; H10N 30/871
See application file for complete search history.

(56) References Cited

U.S. PATENT DOCUMENTS 11,548,030 B2 * 1/2023 Ohta ................. H03H 9/17
2011/0175491 A1 * 7/2011 Miyano ............. H10N 30/871
310/323.16
(Continued)

FOREIGN PATENT DOCUMENTS

JP H02-138781 A 5/1990
JP 2015-185819 A 10/2015
(Continued)

OTHER PUBLICATIONS

English Translation of WO 2006068245 (Year: 2006).*
(Continued)

*Primary Examiner* — Bryan P Gordon
(74) *Attorney, Agent, or Firm* — Oliff PLC

(57) ABSTRACT

A vibration device includes a bimorph type piezoelectric element having a first main surface and a second main surface facing each other and a vibration member bonded to the second main surface of the piezoelectric element. The piezoelectric element has a first active region disposed closer to the first main surface between the first and second main surfaces and a second active region disposed closer to the second main surface than the first active region between the first and second main surfaces. When a force generated in the first active region is F1, a force generated in the second active region is F2, and a force by which the vibration member restrains the second active region is Fr, $F2-F1 \geq Fr$ is satisfied.

6 Claims, 10 Drawing Sheets

(51) Int. Cl.
  *H10N 30/20*   (2023.01)
  *H10N 30/50*   (2023.01)
  *H10N 30/87*   (2023.01)
  *H10N 30/853*  (2023.01)

(52) U.S. Cl.
  CPC ....... *H10N 30/871* (2023.02); *H10N 30/8536* (2023.02); *H10N 30/8548* (2023.02); *H10N 30/8554* (2023.02)

(56) References Cited

U.S. PATENT DOCUMENTS

| | | | | |
|---|---|---|---|---|
| 2015/0321222 A1* | 11/2015 | Kim | ...................... | H10N 30/204 310/366 |
| 2016/0056367 A1* | 2/2016 | Tada | ...................... | G02B 15/144 359/696 |
| 2018/0069168 A1* | 3/2018 | Ikeuchi | .................. | H10N 30/40 |

FOREIGN PATENT DOCUMENTS

| | | | |
|---|---|---|---|
| JP | 2015-216373 A | 12/2015 | |
| WO | 2006/068245 A1 | 6/2006 | |

OTHER PUBLICATIONS

Sep. 8, 2020 International Preliminary Report on Patentability issued in International Patent Application No. PCT/JP2019/006628.

May 28, 2019 International Search Report issued in International Patent Application No. PCT/JP2019/006628.

* cited by examiner

VIBRATION DEVICE AND PIEZOELECTRIC ELEMENT

TECHNICAL FIELD

The present invention relates to a vibration device and a piezoelectric element.

BACKGROUND ART

Known piezoelectric elements have a first active region and a second active region (for example, Patent Literature 1). The piezoelectric element has a first main surface and a second main surface facing each other. The first active region is disposed on the first main surface side between the first and second main surfaces. The second active region is disposed on the second main surface side. The piezoelectric element is, for example, a bimorph type piezoelectric element in which the first active region and the second region expand and contract in opposite directions when an electric field is applied.

CITATION LIST

Patent Literature

Patent Literature 1: Japanese Unexamined Patent Publication No. H02-138781

SUMMARY OF INVENTION

Technical Problem

The bimorph type piezoelectric element bends when the first and second active regions expand and contract in opposite directions. However, for example, when a vibration device is formed by bonding a vibration member to the second main surface of the bimorph type piezoelectric element, the second active region disposed on the second main surface side is restrained by the vibration member. For this reason, bending that occurs in the piezoelectric element is significantly reduced. In this case, since it is difficult for the energy generated in the entire piezoelectric element to be transmitted to the vibration member, it is difficult to obtain a desired amount of vibration as a vibration device.

It is an object of one aspect of the present invention to provide a vibration device capable of efficiently securing a desired amount of vibration and a piezoelectric element used in the vibration device.

Solution to Problem

A vibration device according to one aspect of the present invention includes a bimorph type piezoelectric element and a vibration member. The piezoelectric element has a first main surface and a second main surface facing each other. The piezoelectric element has a first active region and a second active region. The first active region is disposed on the first main surface side between the first and second main surfaces. The second active region is disposed closer to the second main surface side than the first active region between the first and second main surfaces. The vibration member is bonded to the second main surface of the piezoelectric element. When a force generated in the first active region is F1, a force generated in the second active region is F2, and a force by which the vibration member restrains the second active region is Fr, $F2-F1 \geq Fr$ is satisfied.

In the vibration device according to one aspect of the present invention, a value obtained by subtracting the force F1 generated in the first active region from the force F2 generated in the second active region is equal to or greater than the force Fr by which the vibration member restrains the second active region. For this reason, even if the vibration member is bonded to the piezoelectric element, the second active region closer to the vibration member than the first active region is generates a force equal to or greater than the force generated in the first active region. As a result, the energy generated in the entire piezoelectric element can be efficiently transmitted to the vibration member. Therefore, in the vibration device, a desired amount of vibration can be efficiently secured.

A piezoelectric element according to one aspect of the present invention is a bimorph type piezoelectric element. The piezoelectric element has a first main surface and a second main surface facing each other. The second main surface of the piezoelectric element is bonded to the vibration member to form a vibration device. The piezoelectric element includes a first active region, a second active region, a first internal electrode, and a second internal electrode. The first active region is disposed on the first main surface side between the first and second main surfaces. The second active region is disposed closer to the second main surface side than the first active region between the first and second main surfaces. The first internal electrode applies an electric field to the first active region. The second internal electrode applies an electric field to the second active region. Each of the first active region and the second active region is formed by at least one piezoelectric layer. When a displacement amount of the first active region is X1 and a displacement amount of the second active region is X2, $X1 < X2$ is satisfied.

In the piezoelectric element according to one aspect of the present invention, the displacement amount X2 of the second active region is larger than the displacement amount X1 of the first active region. For example, when the vibration member is bonded to the second main surface of the piezoelectric element, the second active region is located closer to the vibration member than the first active region. For this reason, the energy generated in the entire piezoelectric element can be efficiently transmitted to the vibration member.

Advantageous Effects of Invention

According to one aspect of the present invention, it is possible to provide a vibration device capable of efficiently securing a desired amount of vibration and a piezoelectric element used in the vibration device.

DESCRIPTION OF EMBODIMENTS

Figure 1:
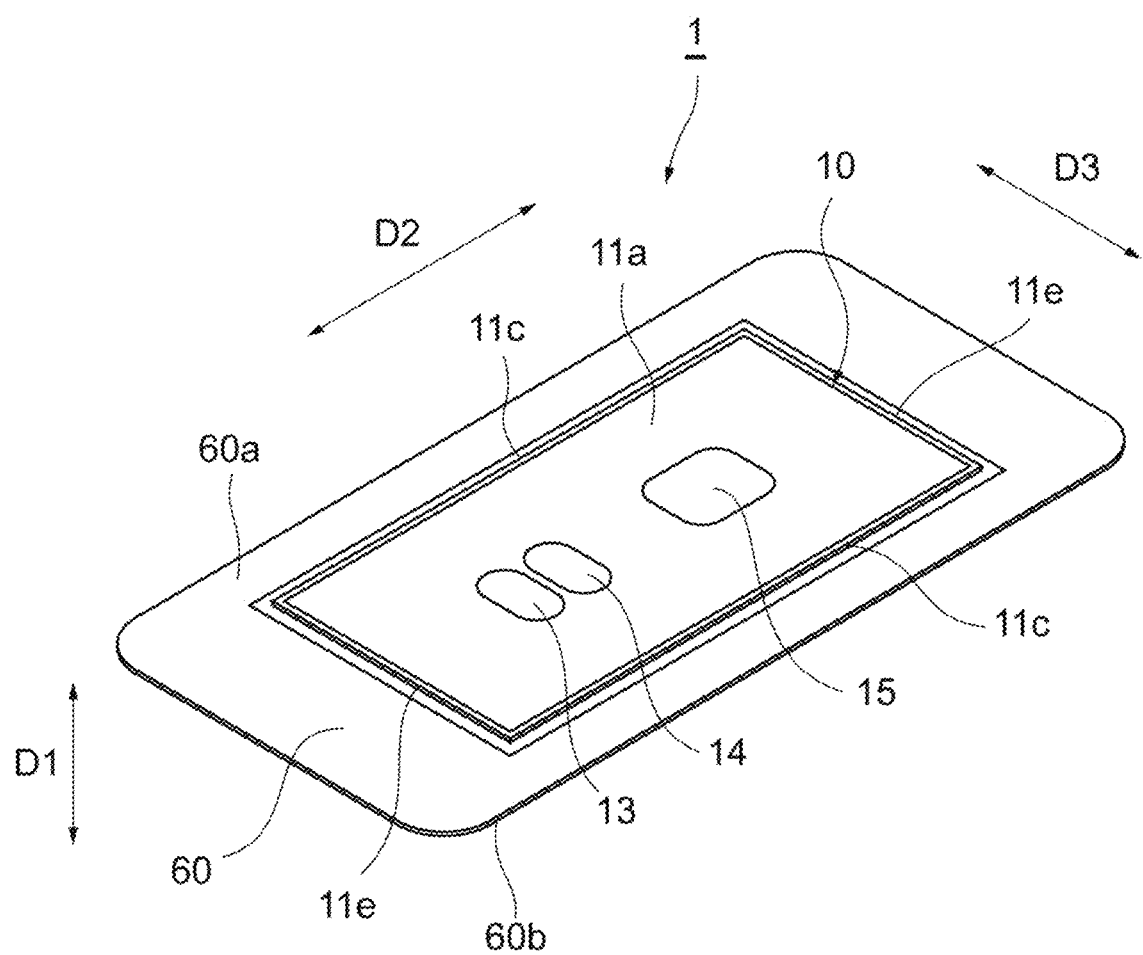
FIG. 1 is a perspective view of a vibration device according to an embodiment.

Hereinafter, embodiments of the present invention will be described in detail with reference to the accompanying diagrams. In addition, in the description, the same elements or elements having the same function are denoted by the same reference numerals, and repeated description thereof will be omitted.

Figure 2:
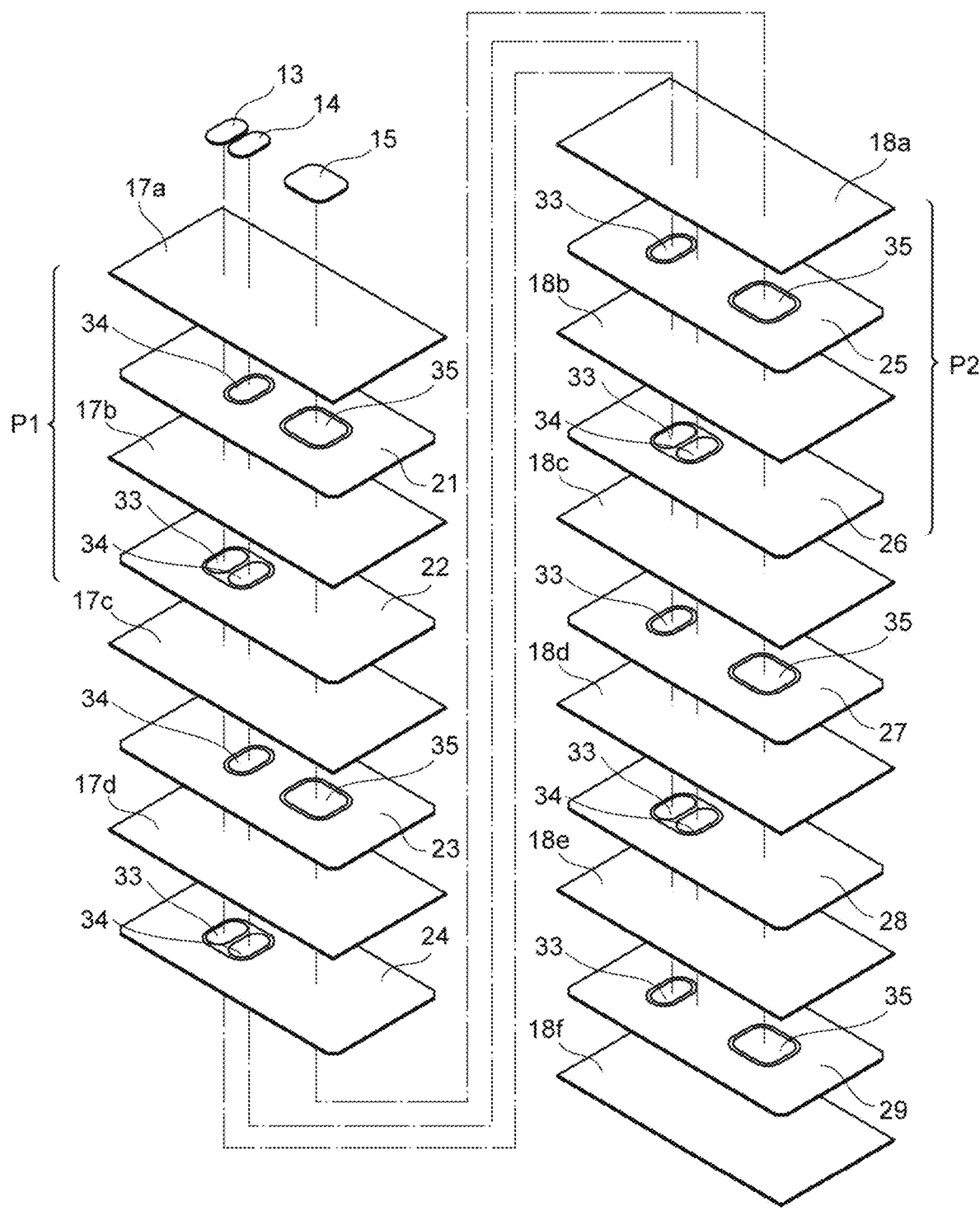
FIG. 2 is an exploded perspective view of the piezoelectric element.
Figure 3:
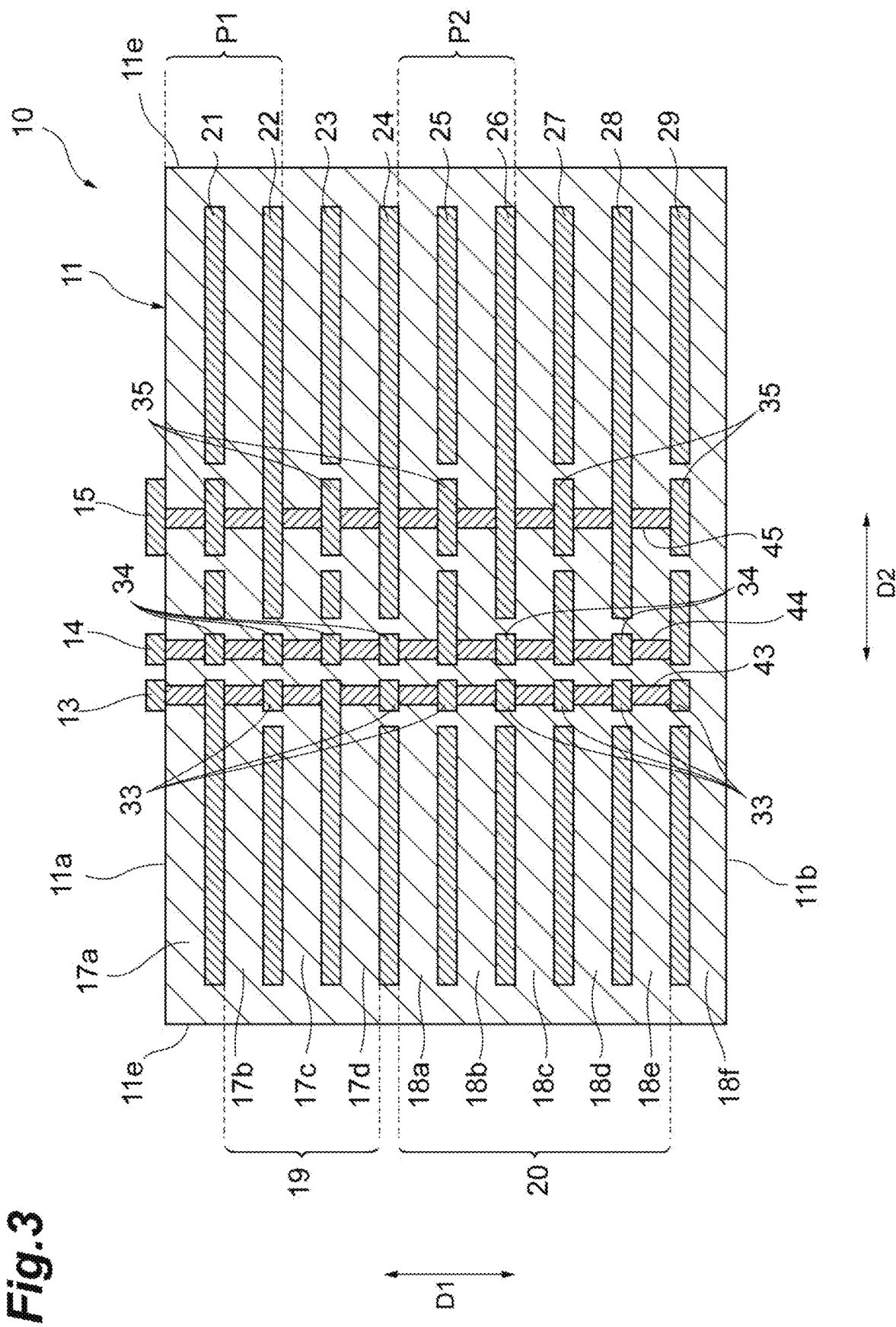
FIG. 3 is a cross-sectional view of the piezoelectric element.

First, the configuration of a vibration device according to the present embodiment will be described with reference to FIGS. 1 to 3. FIG. 1 is a plan view of the vibration device according to the present embodiment. FIG. 2 is an exploded perspective view of a piezoelectric element used in the vibration device according to the present embodiment. FIG. 3 is a diagram illustrating the cross-sectional configuration of the piezoelectric element used in the vibration device according to the present embodiment.

A vibration device 1 includes a piezoelectric element 10 and a vibration member 60, as illustrated in FIGS. 1 and 2. The piezoelectric element 10 is a bimorph type, and has a piezoelectric body 11 and a plurality of external electrodes 13, 14, and 15. In the present embodiment, the piezoelectric element 10 has three external electrodes 13, 14, and 15.

The piezoelectric body 11 has a rectangular parallelepiped shape. The piezoelectric body 11 has a pair of main surfaces 11a and 11b facing each other, a pair of side surfaces 11c facing each other, and a pair of side surfaces 11e facing each other. For example, when the main surface 11a is a first main surface, the main surface 11b is a second main surface. Examples of the rectangular parallelepiped shape include a rectangular parallelepiped shape with chamfered corner portions and ridge portions and a rectangular parallelepiped shape with rounded corner portions and ridge portions. The direction in which a pair of main surfaces 11a and 11b face each other is a first direction D1. The first direction D1 is also a direction perpendicular to the main surfaces 11a and 11b. The direction in which a pair of side surfaces 11e face each other is a second direction D2. The second direction D2 is also a direction perpendicular to each side surface 11c. The direction in which a pair of side surfaces 11c face each other is a third direction D3. The third direction D3 is also a direction perpendicular to each side surface 11e.

Each of the main surfaces 11a and 11b has a pair of long sides and a pair of short sides. Each of the main surfaces 11a and 11b has a rectangular shape having a pair of long sides and a pair of short sides. That is, the piezoelectric element 10 and the piezoelectric body 11 have a rectangular shape having a pair of long sides and a pair of short sides in a plan view. Examples of the rectangular shape include a shape in which each corner is chamfered and a shape in which each corner is rounded. In the present embodiment, the long side direction of each of the main surfaces 11a and 11b matches the second direction D2. The short side direction of each of the main surfaces 11a and 11b matches the third direction D3.

A pair of side surfaces 11c extend in the first direction D1 so as to connect a pair of main surfaces 11a and 11b to each other. A pair of side surfaces 11c also extend in the third direction D3. A pair of side surfaces 11e extend in the first direction D1 so as to connect a pair of main surfaces 11a and 11b to each other. A pair of side surfaces 11e also extend in the second direction D2. The length of the piezoelectric body 11 in the second direction D2 is, for example, 20 mm. The length of the piezoelectric body 11 in the third direction D3 is, for example, 10 mm. The length of the piezoelectric body 11 in the first direction D1 is, for example, 0.25 mm. Each of the main surfaces 11a and 11b and each of the side surfaces 11c and 11e may be indirectly adjacent to each other. In this case, the ridge portion is located between each of the main surfaces 11a and 11b and each of the side surfaces 11c and 11e.

In the piezoelectric body 11, as illustrated in FIGS. 2 and 3, a plurality of piezoelectric layers 17a, 17b, 17c, 17d, 18a, 18b, 18c, 18d, 18e, and 18f are laminated in the first direction D1. The piezoelectric layer 17a has the main surface 11a. The piezoelectric layer 18f has the main surface 11b. The piezoelectric layers 17b, 17c, 17d, 18a, 18b, 18c, 18d, and 18e are located between the piezoelectric layers 17a and 18f. The polarization directions of the piezoelectric layers 17b, 17d, 18b, 18d, and 18f are opposite to the polarization directions of the piezoelectric layers 17a, 17c, 18a, 18c, and 18e. That is, in the piezoelectric body 11, piezoelectric layers having opposite polarization directions are alternately disposed in the first direction D1. In the present embodiment, the piezoelectric layers 17a, 17b, 17c, 17d, 18a, 18b, 18c, 18d, 18e, and 18f have the same thickness. "Same" includes the range of manufacturing error.

Each of the piezoelectric layers 17a, 17b, 17c, 17d, 18a, 18b, 18c, 18d, 18e, and 18f is formed of a piezoelectric material. In the present embodiment, each of the piezoelectric layers 17a, 17b, 17c, 17d, 18a, 18b, 18c, 18d, 18e, and 18f is formed of a piezoelectric ceramic material. As the piezoelectric ceramic material, for example, $PZT[Pb(Zr,Ti)O_3]$, $PT(PbTiO_3)$, $PLZT[(Pb,La)(Zr,Ti)O_3]$, or barium titanate $(BaTiO_3)$ is used. Each of the piezoelectric layers 17a, 17b, 17c, 17d, 18a, 18b, 18c, 18d, 18e, and 18f is formed of, for example, a sintered body of a ceramic green sheet containing the above-described piezoelectric ceramic material. In the actual piezoelectric body 11, the piezoelectric layers 17a, 17b, 17c, 17d, 18a, 18b, 18c, 18d, 18e, and 18f are integrated to the extent that the boundaries between the piezoelectric layers 17a, 17b, 17c, 17d, 18a, 18b, 18c, 18d, 18e, and 18f cannot be recognized.

Each of the external electrodes 13, 14, and 15 is disposed on the main surface 11a. The external electrodes 13, 14, and 15 are disposed in the second direction D2 in the order of the external electrode 13, the external electrode 14, and the external electrode 15. The external electrode 13 and the external electrode 14 are adjacent to each other in the second direction D2. The external electrode 14 and the external electrode 15 are adjacent to each other in the second direction D2. In the second direction D2, the shortest distance between the external electrodes 14 and 15 is longer than the shortest distance between the external electrodes 13 and 14. Each of the external electrodes 13, 14, and 15 is spaced apart from all the edges (four sides) of the main surface 11a when viewed from the first direction D1.

Each of the external electrodes 13 and 14 has a rectangular shape when viewed from the first direction D1. Examples of the rectangular shape include a shape in which each corner is chamfered and a shape in which each corner is rounded. In the present embodiment, each corner having a rectangular shape is rounded. The external electrode 15 has a square shape when viewed from the first direction D1. Examples of the square shape include a shape in which each corner is chamfered and a shape in which each corner is rounded. In the present embodiment, each corner having a square shape is rounded. Each of the external electrodes 13, 14, and 15 is formed of a conductive material. As the conductive material, for example, Ag, Pd, Pt, or Ag—Pd alloy is used. Each of the external electrodes 13, 14, and 15 is configured, for example, as a sintered body of a conductive paste containing the above-described conductive material.

As illustrated in FIGS. 2 and 3, the piezoelectric element 10 includes a plurality of internal electrodes 21, 22, 23, 24, 25, 26, 27, 28, and 29 disposed inside the piezoelectric body 11. Each of the internal electrodes 21, 22, 23, 24, 25, 26, 27, 28, and 29 is formed of a conductive material. As the conductive material, for example, Ag, Pd, Pt, or Ag—Pd alloy is used. Each of the internal electrodes 21, 22, 23, 24, 25, 26, 27, 28, and 29 is configured, for example, as a sintered body of a conductive paste containing the above-described conductive material. In the present embodiment, the outer shape of each of the internal electrodes 21, 22, 23, 24, 25, 26, 27, 28, and 29 is rectangular. Examples of the rectangular shape include a shape in which each corner is chamfered and a shape in which each corner is rounded.

The internal electrodes 21, 22, 23, 24, 25, 26, 27, 28, and 29 are disposed at different positions (layers) in the first direction D1. The internal electrodes 21, 22, 23, 24, 25, 26, 27, 28, and 29 face each other with a space therebetween in the first direction D1. The internal electrodes 21, 22, 23, 24, 25, 26, 27, 28, and 29 are not exposed on the surface of the piezoelectric body 11. That is, the internal electrodes 21, 22, 23, 24, 25, 26, 27, 28, and 29 are not exposed on the side surfaces 11c and 11e. The internal electrodes 21, 22, 23, 24, 25, 26, 27, 28, and 29 are spaced apart from all the edges (four sides) of the main surfaces 11a and 11b when viewed from the first direction D1.

The internal electrode 21 is located between the piezoelectric layer 17a and the piezoelectric layer 17b. The internal electrode 22 is located between the piezoelectric layers 17b and 17c. The internal electrode 23 is located between the piezoelectric layer 17c and the piezoelectric layer 17d. The internal electrode 24 is located between the piezoelectric layer 17d and the piezoelectric layer 18a. The internal electrode 25 is located between the piezoelectric layer 18a and the piezoelectric layer 18b. The internal electrode 26 is located between the piezoelectric layer 18b and the piezoelectric layer 18c. The internal electrode 27 is located between the piezoelectric layer 18c and the piezoelectric layer 18d. The internal electrode 28 is located between the piezoelectric layer 18d and the piezoelectric layer 18e. The internal electrode 29 is located between the piezoelectric layer 18e and the piezoelectric layer 18f.

The external electrode 13 is electrically connected to the internal electrode 21, the internal electrode 23, and a plurality of connection conductors 33 through a plurality of via conductors 43. The plurality of connection conductors 33 are located in the same layer as the internal electrodes 22, 24, 25, 26, 27, 28, and 29, respectively. Specifically, each connection conductor 33 is located in the opening formed in each of the internal electrodes 22, 24, 25, 26, 27, 28, and 29. Each opening is formed at a position corresponding to the external electrode 13 when viewed from the first direction D1. That is, each connection conductor 33 is surrounded by each of the internal electrodes 22, 24, 25, 26, 27, 28, and 29 when viewed from the first direction D1. Each connection conductor 33 is spaced apart from each of the internal electrodes 22, 24, 25, 26, 27, 28, and 29.

Each connection conductor 33 faces the external electrode 13 in the first direction D1, and is disposed at a position overlapping the external electrode 13 when viewed from the first direction D1. Each connection conductor 33 faces the internal electrodes 21 and 23 in the first direction D1, and is disposed at a position overlapping the internal electrodes 21 and 23 when viewed from the first direction D1. Each of the plurality of via conductors 43 is interposed between elements adjacent to each other in the first direction D1 among a plurality of elements of the external electrode 13, the internal electrode 21, the internal electrode 23, and the plurality of connection conductors 33. The plurality of via conductors 43 are disposed at positions overlapping the external electrode 13 when viewed from the first direction D1. The plurality of via conductors 43 respectively pass through the corresponding piezoelectric layers 17a, 17b, 17c, 17d, 18a, 18b, 18c, 18d, and 18e in the first direction D1.

The external electrode 14 is electrically connected to the internal electrode 25, the internal electrode 27, the internal electrode 29, and a plurality of connection conductors 34 through a plurality of via conductors 44. The plurality of connection conductors 34 are located in the same layer as the internal electrodes 21, 22, 23, 24, 26, and 28, respectively. Specifically, each connection conductor 34 is located in the opening formed in each of the internal electrodes 21, 22, 23, 24, 26, and 28. Each opening is formed at a position corresponding to the external electrode 14 when viewed from the first direction D1. That is, each connection conductor 34 is surrounded by each of the internal electrodes 21, 22, 23, 24, 26, and 28 when viewed from the first direction D1. Each connection conductor 34 is spaced apart from each of the internal electrodes 21, 22, 23, 24, 26, and 28. Each connection conductor 34 is spaced apart from each connection conductor 33.

The connection conductor 33 and the connection conductor 34 located in the same layer as the internal electrode 22 are located adjacent to each other in the same opening. The connection conductor 33 and the connection conductor 34 located in the same layer as the internal electrode 24 are located adjacent to each other in the same opening. The connection conductor 33 and the connection conductor 34 located in the same layer as the internal electrode 26 are located adjacent to each other in the same opening. The connection conductor 33 and the connection conductor 34 located in the same layer as the internal electrode 28 are located adjacent to each other in the same opening.

Each connection conductor 34 faces the external electrode 14 in the first direction D1, and is disposed at a position overlapping the external electrode 14 when viewed from the first direction D1. Each connection conductor 34 faces the internal electrodes 25, 27, and 29 in the first direction D1, and is disposed at a position overlapping the internal electrodes 25, 27, and 29 when viewed from the first direction D1. Each of the plurality of via conductors 44 is interposed between elements adjacent to each other in the first direction D1 among a plurality of elements of the external electrode 14, the internal electrode 25, the internal electrode 27, the internal electrode 29, and the plurality of connection conductors 34. The plurality of via conductors 44 are disposed at positions overlapping the external electrodes 14 when viewed from the first direction D1. The plurality of via conductors 44 respectively pass through the corresponding piezoelectric layers 17a, 17b, 17c, 17d, 18a, 18b, 18c, 18d, and 18e in the first direction D1.

The external electrode 15 is electrically connected to the internal electrode 22, the internal electrode 24, the internal electrode 26, the internal electrode 28, and a plurality of connection conductors 35 through a plurality of via conductors 45. The plurality of connection conductors 35 are located in the same layer as the internal electrodes 21, 23, 25, 27, and 29, respectively. Specifically, each connection conductor 35 is located in the opening formed in each of the internal electrode 21, 23, 25, 27, and 29. Each opening is formed at a position corresponding to the external electrode 15 when viewed from the first direction D1. That is, the entire edge of each connection conductor 35 is surrounded by each of the internal electrodes 21, 23, 25, 27, and 29 when viewed from the first direction D1. Each opening is formed at a position corresponding to the external electrode 15 when viewed from the first direction D1.

Each connection conductor 35 faces the external electrode 15 in the first direction D1, and is disposed at a position overlapping the external electrode 15 when viewed from the first direction D1. Each connection conductor 35 faces the internal electrodes 22, 24, 26, and 28 in the first direction D1, and is disposed at a position overlapping the internal electrodes 22, 24, 26, and 28 when viewed from the first direction D1. Each of the plurality of via conductors 45 is interposed between elements adjacent to each other in the first direction D1 among a plurality of elements of the external electrode 15, the internal electrode 22, the internal electrode 24, the internal electrode 26, the internal electrode 28, and the plurality of connection conductors 35. The plurality of via conductors 45 are disposed at positions overlapping the external electrodes 15 when viewed from the first direction D1. The plurality of via conductors 45 respectively pass through the corresponding piezoelectric layers 17a, 17b, 17c, 17d, 18a, 18b, 18c, 18d, and 18e in the first direction D1.

Each of the connection conductors 33 and 34 has a rectangular shape when viewed from the first direction D1. Examples of the rectangular shape include a shape in which each corner is chamfered and a shape in which each corner is rounded. In the present embodiment, each corner having a rectangular shape is rounded. Each connection conductor 35 has a square shape when viewed from the first direction D1. Examples of the square shape include a shape in which each corner is chamfered and a shape in which each corner is rounded. In the present embodiment, each corner having a square shape is rounded.

The connection conductors 33, 34, and 35 and the via conductors 43, 44, and 45 are formed of a conductive material. As the conductive material, for example, Ag, Pd, Pt, or Ag—Pd alloy is used. The connection conductors 33, 34, and 35 and the via conductors 43, 44, and 45 are configured, for example, as a sintered body of a conductive paste containing the above-described conductive material. The via conductors 43, 44, and 45 are formed by sintering the conductive paste filled in through holes formed in a ceramic green sheet for forming the corresponding piezoelectric layers 17a, 17b, 17c, 17d, 18a, 18b, 18c, 18d, and 18e.

On the main surface 11b of the piezoelectric body 11, conductors electrically connected to the internal electrodes 21 and 23, conductors electrically connected to the internal electrodes 25, 27, and 29, and conductors electrically connected to the internal electrodes 22, 24, 26, and 28 are not disposed. In the present embodiment, when the main surface 11b is viewed from the first direction D1, the entire main surface 11b is exposed. The main surfaces 11a and 11b are natural surfaces. The natural surface is a surface formed by the surface of crystal grains grown by baking.

Also on each of the side surfaces 11c and 11e of the piezoelectric body 11, conductors electrically connected to the internal electrodes 21 and 23, conductors electrically connected to the internal electrodes 25, 27, and 29, and conductors electrically connected to the internal electrodes 22, 24, 26, and 28 are not disposed. In the present embodiment, when each side surface 11c is viewed from the third direction D3, the entire side surface 11c is exposed. When each side surface 11e is viewed from the second direction D2, the entire side surface 11e is exposed. In the present embodiment, each of the side surfaces 11c and 11e is also a natural surface.

In the plurality of piezoelectric layers 17b, 17c, and 17d, regions interposed between the internal electrodes 21 and 23 and the internal electrodes 22 and 24 form a first active region 19 that is piezoelectrically active. The internal electrodes 21 and 23 are connected to the external electrode 13. The internal electrodes 22 and 24 are connected to the external electrode 15. In the plurality of piezoelectric layers 18a, 18b, 18c, 18d, and 18e, regions interposed between the internal electrodes 25, 27, and 29 and the internal electrodes 24, 26, and 28 form a second active region 20 that is piezoelectrically active. The internal electrodes 25, 27, and 29 are connected to the external electrode 14. The internal electrodes 24, 26, and 28 are connected to the external electrode 15. The first active region 19 and the second active region 20 are disposed between the main surface 11a and the main surface 11b. The second active region 20 is disposed closer to the main surface 11b than the first active region 19. The first active region 19 and the second active region 20 are formed by at least one piezoelectric layer.

In the present embodiment, the first active region 19 and the second active region 20 are located so as to surround the plurality of external electrodes 13, 14, and 15 when viewed from the first direction D1. The first active region 19 and the second active region 20 include a region located between the external electrode 14 and the external electrode 15 when viewed from the first direction D1 and a region outside the region where the external electrodes 13, 14, and 15 are located when viewed from the first direction D1.

In the piezoelectric element 10, a pattern P1 configured in the order of a piezoelectric layer, an internal electrode connected to the external electrode 13, a piezoelectric layer, and an internal electrode connected to the external electrode 15 is repeatedly disposed in the first direction D1. In the piezoelectric element 10, subsequent to the pattern P1, a pattern P2 configured in the order of a piezoelectric layer, an internal electrode connected to the external electrode 14, a piezoelectric layer, and an internal electrode connected to the external electrode 15 is repeatedly disposed in the first direction D1. In other words, in the present embodiment, in the piezoelectric element 10, in the first direction D1, X groups of patterns P1 forming the first active region 19 are disposed and Y groups of patterns P2 forming the second active region 20 are disposed.

In the present embodiment, in the first direction D1, two groups of patterns P1 forming the first active region 19 are disposed and three groups of patterns P2 forming the second active region 20 are disposed. That is, X=2 and Y=3, and X<Y is satisfied. In this case, when the number of piezoelectric layers forming the first active region 19 is N1 and the number of piezoelectric layers forming the second active region 20 is N2, N1=3 and N2=5, and N1<N2 is satisfied. That is, the number N2 of piezoelectric layers forming the second active region 20 is larger than the number N1 of piezoelectric layers forming the first active region 19.

Figure 4:
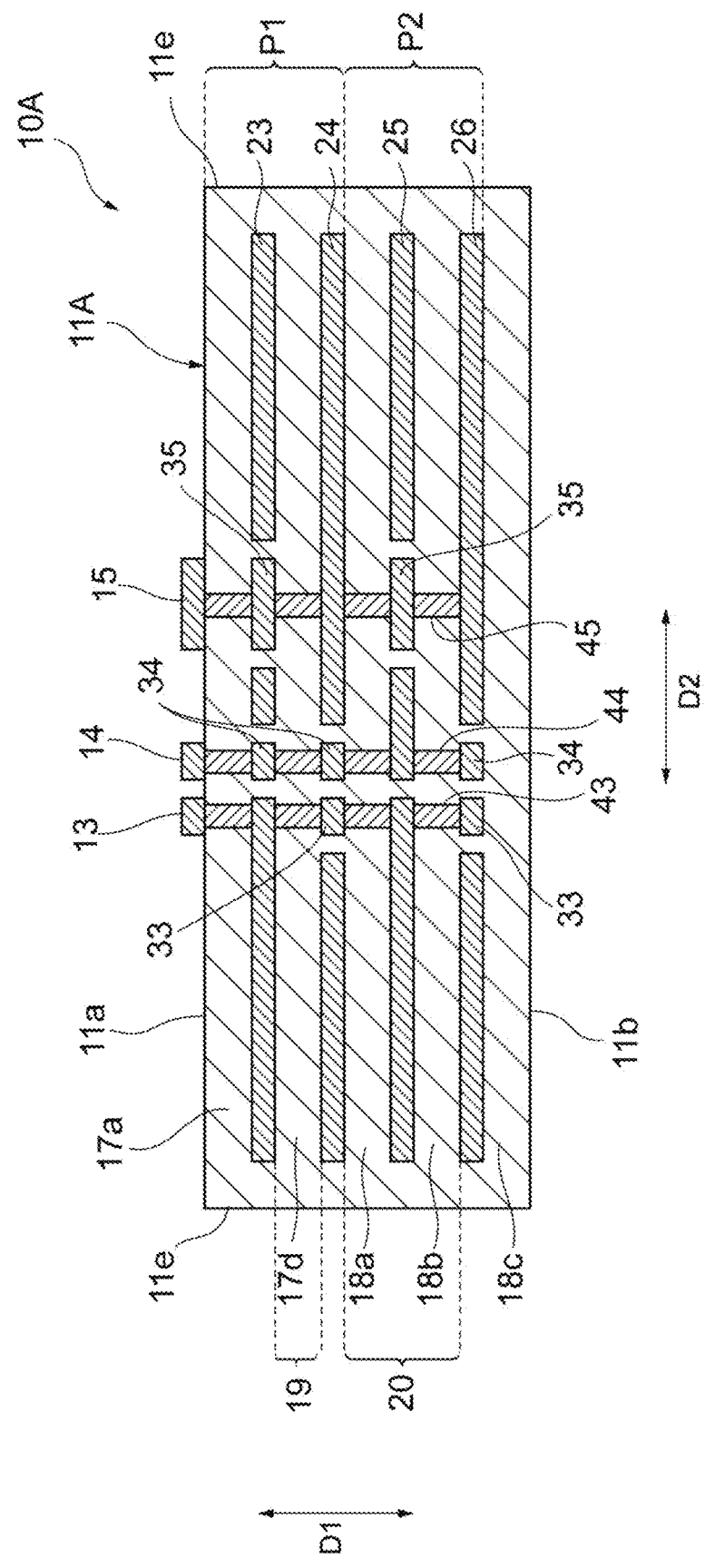
FIG. 4 is a cross-sectional view of a piezoelectric element used in a vibration device according to a modification example of the present embodiment.

The number X of patterns P1 and the number Y of patterns P2 in the piezoelectric element 10 are not limited to the configuration of the present embodiment. For example, in a piezoelectric element 10A illustrated in FIG. 4, the number of a plurality of piezoelectric layers and the number of internal electrodes are different from those in the piezoelectric element 10 described above. FIG. 4 is a cross-sectional view of a piezoelectric element used in a vibration device according to a modification example of the first embodiment. Specifically, in the piezoelectric element 10A, a plurality of piezoelectric layers 17a, 17d, 18a, 18b, and 18c are sequentially laminated in the first direction D1. In the piezoelectric element 10A, the piezoelectric layers 17b, 17c, 18d, 18e, and 18f are not provided. The piezoelectric layer 17a has the main surface 11a. The piezoelectric layer 18c has the main surface 11b. The piezoelectric element 10A includes a plurality of internal electrodes 23, 24, 25, and 26 in the piezoelectric body 11A. The piezoelectric element 10A does not include the internal electrodes 21, 22, 27, 28, and 29.

In the piezoelectric element 10A, in the first direction D1, one group of pattern P1 forming the first active region 19 is disposed and one group of pattern P2 forming the second active region 20 is disposed. That is, X=1 and Y=1. Also in this case, when the number of piezoelectric layers forming the first active region 19 is N1 and the number of piezoelectric layers forming the second active region 20 is N2, N1=1 and N2=2, and N1<N2 is satisfied.

Figure 5:
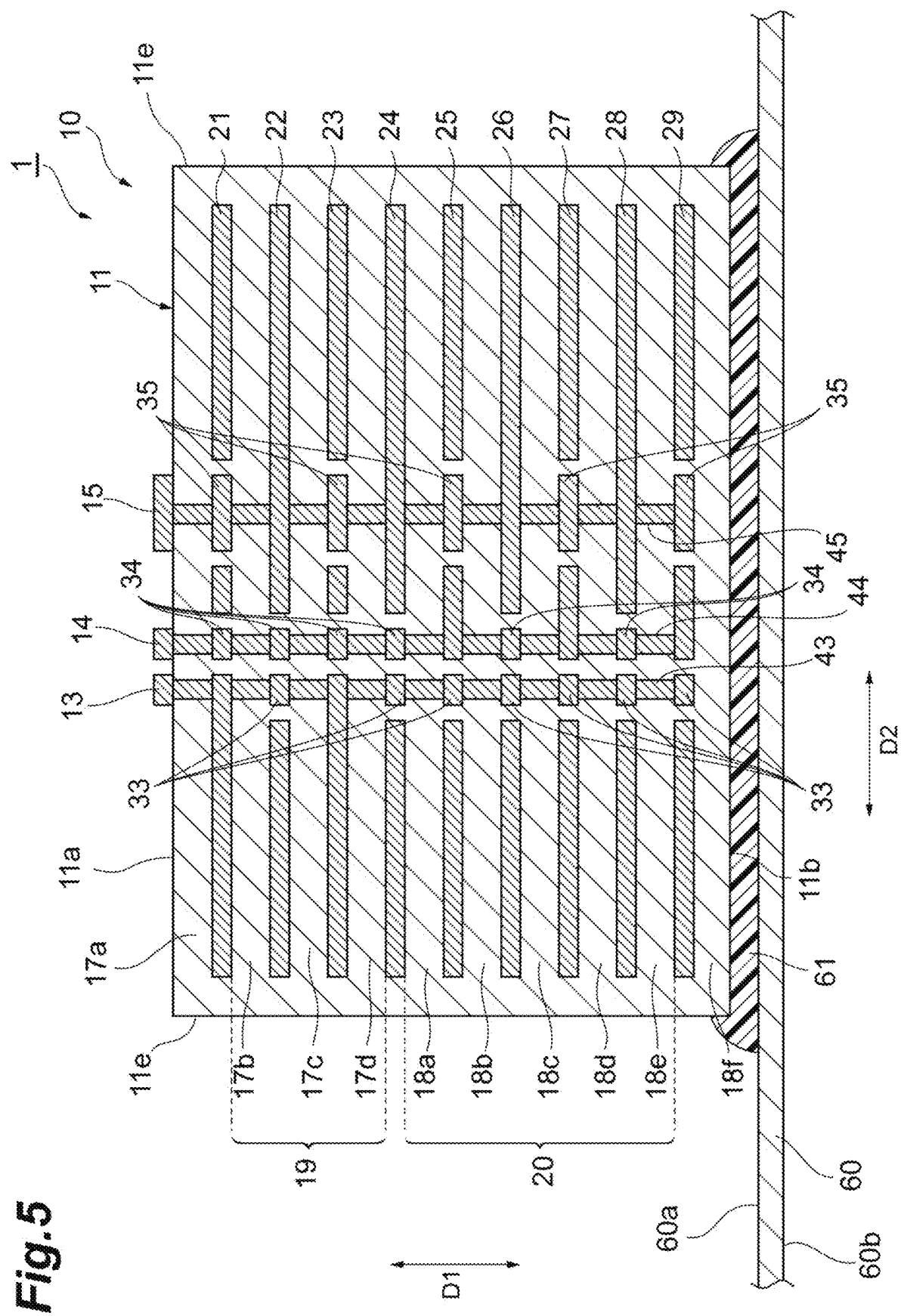
FIG. 5 is a diagram illustrating a state in which a piezoelectric element is bonded to a vibration device.

The vibration member 60 has main surfaces 60a and 60b facing each other, as illustrated in FIG. 5. In the present embodiment, the vibration member 60 is a plate-shaped member. The vibration member 60 is formed of metal, for example. The vibration member 60 is formed of, for example, Ni—Fe alloy, glass, resin, or stainless steel. Each of the main surfaces 60a and 60b has a pair of long sides and a pair of short sides. Each of the main surfaces 60a and 60b has a rectangular shape having a pair of long sides and a pair of short sides.

That is, the vibration member 60 has a rectangular shape having a pair of long sides and a pair of short sides in a plan view.

In the present embodiment, the long side direction of each of the main surfaces 60a and 60b matches the second direction D2. The short side direction of each of the main surfaces 60a and 60b matches the third direction D3. The length of the vibration member 60 in the second direction D2 is, for example, 30 mm. The length of the vibration member 60 in the third direction D3 is, for example, 15 mm. The length of the vibration member 60 in the first direction D1 is, for example, 0.15 mm.

The piezoelectric element 10 is bonded to the vibration member 60 by a resin layer 61. The main surface 11b of the piezoelectric body 11 and the main surface 60a of the vibration member 60 face each other. The resin layer 61 is located between the main surface 11b and the main surface 60a. The main surface 11b and the main surface 60a are bonded to each other by the resin layer 61. The resin layer 61 contains a resin. Examples of the resin include epoxy resin and acrylic resin. The resin layer 61 does not contain a conductive filler and has an electrical insulation property. In a state in which the piezoelectric element 10 is bonded to the vibration member 60, the first direction D1 is the same as a direction in which the main surface 60a and the main surface 60b face each other. When viewed from the first direction D1, the piezoelectric element 10 is disposed at the center of the main surface 60a of the vibration member 60.

Next, an operation in a case where an electric field is applied to the first active region 19 and the second active region 20 of the piezoelectric element 10 will be described in detail.

Voltages having different polarities are applied to the external electrode 13 and the external electrode 14. The voltages applied to the external electrodes 13 and 14 are not applied to the external electrode 15. The external electrode 15 functions as a ground electrode. When the above-described voltage is applied to the external electrode 13, an electric field is generated between the internal electrode 21 and the internal electrode 22, between the internal electrode 22 and the internal electrode 23, and between the internal electrode 23 and the internal electrode 24. When an electric field is generated between the internal electrodes 21 and 23 and the internal electrodes 22 and 24, the electric field is applied to the first active region 19, and a force F1 is generated in the first active region 19 according to the electric field. As a result, the first active region 19 is displaced by a displacement amount X1 corresponding to the force F1.

When the above-described voltage is applied to the external electrode 14, an electric field is generated between the internal electrode 24 and the internal electrode 25, between the internal electrode 25 and the internal electrode 26, between the internal electrode 26 and the internal electrode 27, between the internal electrode 27 and the internal electrode 28, and between the internal electrode 28 and the internal electrode 29. When an electric field is generated between the internal electrodes 25, 27, and 29 and the internal electrodes 24, 26, and 28, the electric field is applied to the second active region 20, and a force F2 is generated in the second active region 20 according to the electric field. As a result, the second active region 20 is displaced by a displacement amount X2 corresponding to the force F2. At this time, the first active region 19 and the second active region 20 are displaced in opposite directions. For this reason, when a voltage is applied to the external electrodes 13 and 14, the piezoelectric element 10 is bent.

In the piezoelectric element 10, when an AC voltage is applied to the external electrodes 13 and 14, the first active region 19 and the second active region 20 repeatedly expand and contract according to the frequency of the applied AC voltage. For this reason, the first active region 19 and the second active region 20 expand and contract in opposite directions, and the piezoelectric element 10 bends and vibrates. The piezoelectric element 10 and the vibration member 60 are bonded to each other. Therefore, according to the bending and vibration in the piezoelectric element 10, the vibration member 60 bends and vibrates integrally with the piezoelectric element 10.

In the piezoelectric element 10 according to the present embodiment, when a voltage is applied to the external electrode 13 and the external electrode 14 as described above, the relationship between the displacement amount X1 of the first active region 19 and the displacement amount X2 of the second active region 20 satisfies X1<X2. That is, the displacement amount X2 of the second active region 20 is larger than the displacement amount X1 of the first active region 19.

When a voltage is applied to the external electrode 13 and the external electrode 14 in a state in which the piezoelectric element 10 and the vibration member 60 are bonded to each other, the relationship among the force F1 generated in the first active region 19, the force F2 generated in the second active region 20, and a force Fr by which the vibration member 60 restrains the second active region 20 satisfies F2−F1≥Fr. That is, the difference between the force F1 generated in the first active region 19 and the force F2 generated in the second active region 20 is equal to or greater than the force Fr by which the vibration member 60 restrains the second active region 20. Here, F2−F1=Fr includes a case where the magnitude relationship between F2−F1 and Fr is different within the manufacturing error range (±10%).

As described above, in the vibration device 1 according to the present embodiment, a value obtained by subtracting the force F1 generated in the first active region 19 from the force F2 generated in the second active region 20 is equal to or greater than the force Fr by which the vibration member 60 restrains the second active region 20. For this reason, even if the vibration member 60 is bonded to the piezoelectric element 10, the second active region 20 closer to the vibration member 60 than the first active region 19 is generates the force F2 equal to or greater than the force F1 generated in the first active region 19. As a result, the energy generated in the entire piezoelectric element 10 can be efficiently transmitted to the vibration member 60. Therefore, in the vibration device 1, a desired amount of vibration can be efficiently secured.

In the piezoelectric element 10, the displacement amount X2 of the second active region 20 is larger than the displacement amount X1 of the first active region 19. For example, when the vibration member 60 is bonded to the main surface 11b of the piezoelectric element 10, the second active region 20 having a larger displacement amount than the first active region 19 is located closer to the vibration member 60 than the first active region 19. For this reason, the energy generated in the entire piezoelectric element 10 can be efficiently transmitted to the vibration member 60.

When the number of piezoelectric layers forming the first active region 19 is N1 and the number of piezoelectric layers forming the second active region 20 is N2, N1<N2 is satisfied. In this case, for example, even if the electric fields applied to the first active region 19 and the second active region 20 are the same, a force larger than that generated in the first active region 19 can be generated in the second active region 20. For this reason, when the vibration member 60 is bonded to the main surface 11b of the piezoelectric element 10, the energy generated in the entire piezoelectric element 10 can be efficiently transmitted to the vibration member 60.

While the embodiment of the present invention has been described above, the present invention is not necessarily limited to the embodiment described above, and various changes can be made without departing from the scope of the present invention.

For example, the present invention is not limited to the configuration of the piezoelectric element 10 used in the vibration device 1 according to the embodiment described above, and a piezoelectric element having a configuration different from that of the piezoelectric element 10 may be configured such that the relationship between the displacement amount X1 of the first active region 19 and the displacement amount X2 of the second active region 20 satisfies X1<X2.

Figure 6:
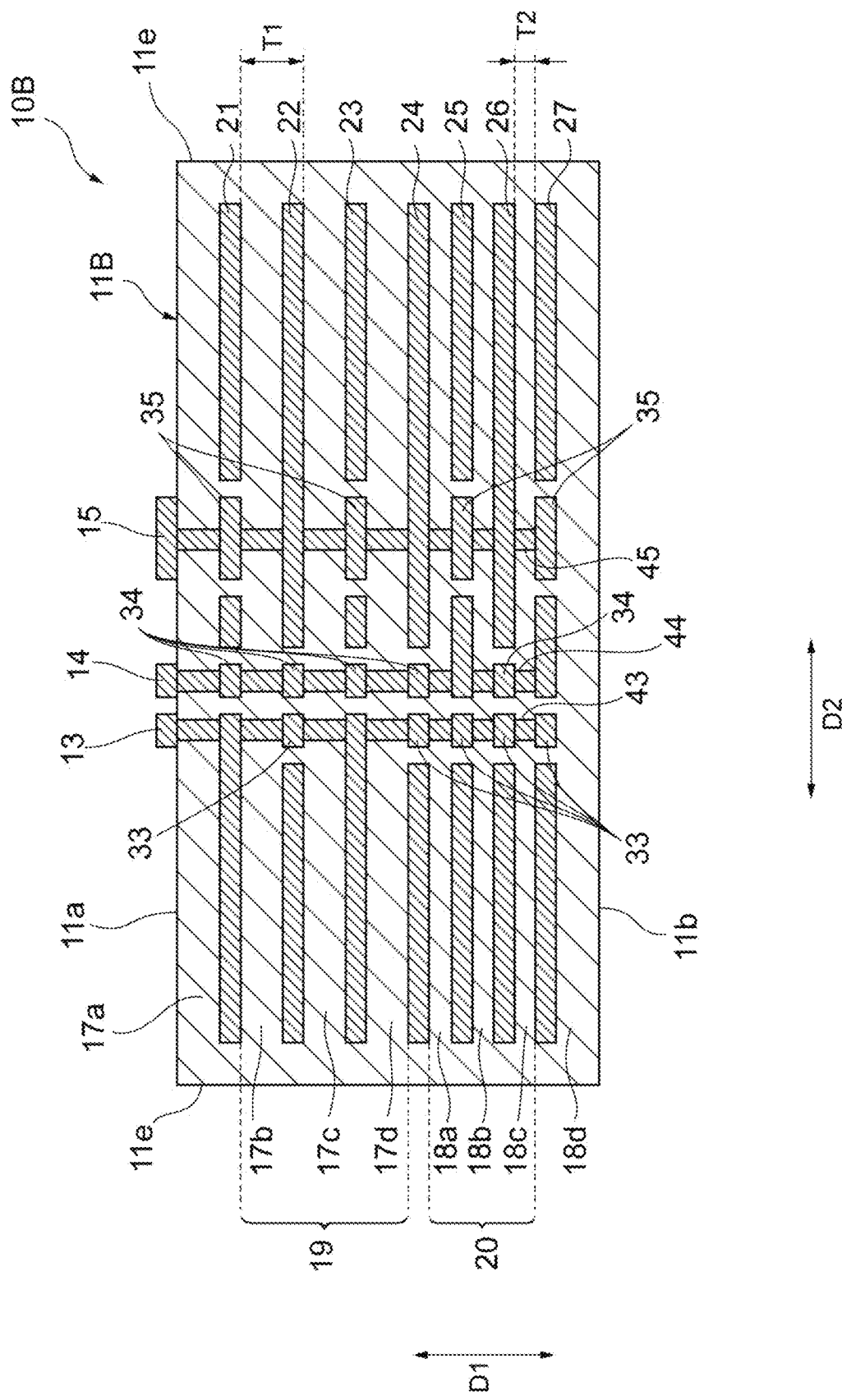
FIG. 6 is a cross-sectional view of a piezoelectric element used in a vibration device according to a modification example of the present embodiment.

For example, the piezoelectric element 10 may be configured as illustrated in FIG. 6. FIG. 6 is a cross-sectional view of a piezoelectric element used in a vibration device according to a modification example of the present embodiment. In the piezoelectric element 10 in the embodiment described above and a piezoelectric element 10B in this modification example, the number of a plurality of piezoelectric layers, the number of internal electrodes, and the thickness of the piezoelectric layer forming the second active region 20 are different.

In the piezoelectric element 10B used in the vibration device 1 according to this modification example, as illustrated in FIG. 6, a plurality of piezoelectric layers 17a, 17b, 17c, 17d, 18a, 18b, 18c, and 18d are sequentially laminated in the first direction D1. That is, the piezoelectric element 10B does not have the piezoelectric layers 18e and 18f. The piezoelectric layer 17a has the main surface 11a. The piezoelectric layer 18d has a main surface 11b.

The piezoelectric element 10B includes a plurality of internal electrodes 21, 22, 23, 24, 25, 26, and 27 in a piezoelectric body 11B. The piezoelectric element 10B does not include the internal electrodes 28 and 29. In this modification example, the number N1 of piezoelectric layers forming the first active region 19 and the number N2 of piezoelectric layers forming the second active region 20 are the same.

In the piezoelectric element 10B, when the thickness of each of the piezoelectric layers 17b, 17c, and 17d forming the first active region 19 is T1 and the thickness of each of the piezoelectric layers 18a, 18b, and 18c forming the second active region 20 is T2, T1>T2 is satisfied. That is, the thickness T2 of each of the piezoelectric layers 18a, 18b, and 18c is smaller than the thickness T1 of each of the piezoelectric layers 17a, 17b, 17c, and 17d. In the piezoelectric element 10B, the thicknesses of the piezoelectric layer 17a and the piezoelectric layer 18d are the same as the thickness T1 of each of the piezoelectric layers 17b, 17c, and 17d. The thicknesses of the piezoelectric layer 17a and the piezoelectric layer 18d may be the same as the thickness T2 of each of the piezoelectric layers 18a, 18b, and 18c.

As described above, in this modification example, when the thickness of each of the piezoelectric layers 17b, 17c, and 17d forming the first active region 19 is T1 and the thickness of each of the piezoelectric layers 18a, 18b, and 18c forming the second active region 20 is T2, T1>T2 is satisfied. In this case, for example, even if the voltages applied to the external electrode 13 and the external electrode 14 are the same, an electric field stronger than the electric field applied to the piezoelectric layers 17b, 17c, and 17d forming the first active region 19 is applied to the piezoelectric layers 18a, 18b, and 18c forming the second active region 20. When viewed from the first direction D1, the area of the first active region 19 interposed between the internal electrodes and the area of the second active region 20 interposed between the internal electrodes are the same. Therefore, even if the voltages applied to the external electrode 13 and the external electrode 14 are the same, a force larger than the force generated in the first active region 19 can be generated in the second active region 20.

In the piezoelectric element 10B illustrated in FIG. 6, the thickness of the piezoelectric element 10B in the first direction D1 can be smaller than that of the piezoelectric element 10 illustrated in FIG. 3. In the piezoelectric element 10 illustrated in FIG. 3, cracks are less likely to occur in the manufacturing process, such as pressing and sintering, and the electric field application process than in the piezoelectric element 10B illustrated in FIG. 6.

In a configuration in which the number N2 of piezoelectric layers forming the second active region 20 is larger than the number N1 of piezoelectric layers forming the first active region 19 as illustrated in FIG. 3, the thickness T2 of each piezoelectric layer forming the second active region 20 may be smaller than the thickness T1 of each piezoelectric layer forming the first active region 19 as described with reference to FIG. 6. In this case, for example, even if the voltages applied to the external electrode 13 and the external electrode 14 are the same, a force larger than the force generated in the first active region can be generated in the second active region 20.

Figure 7:
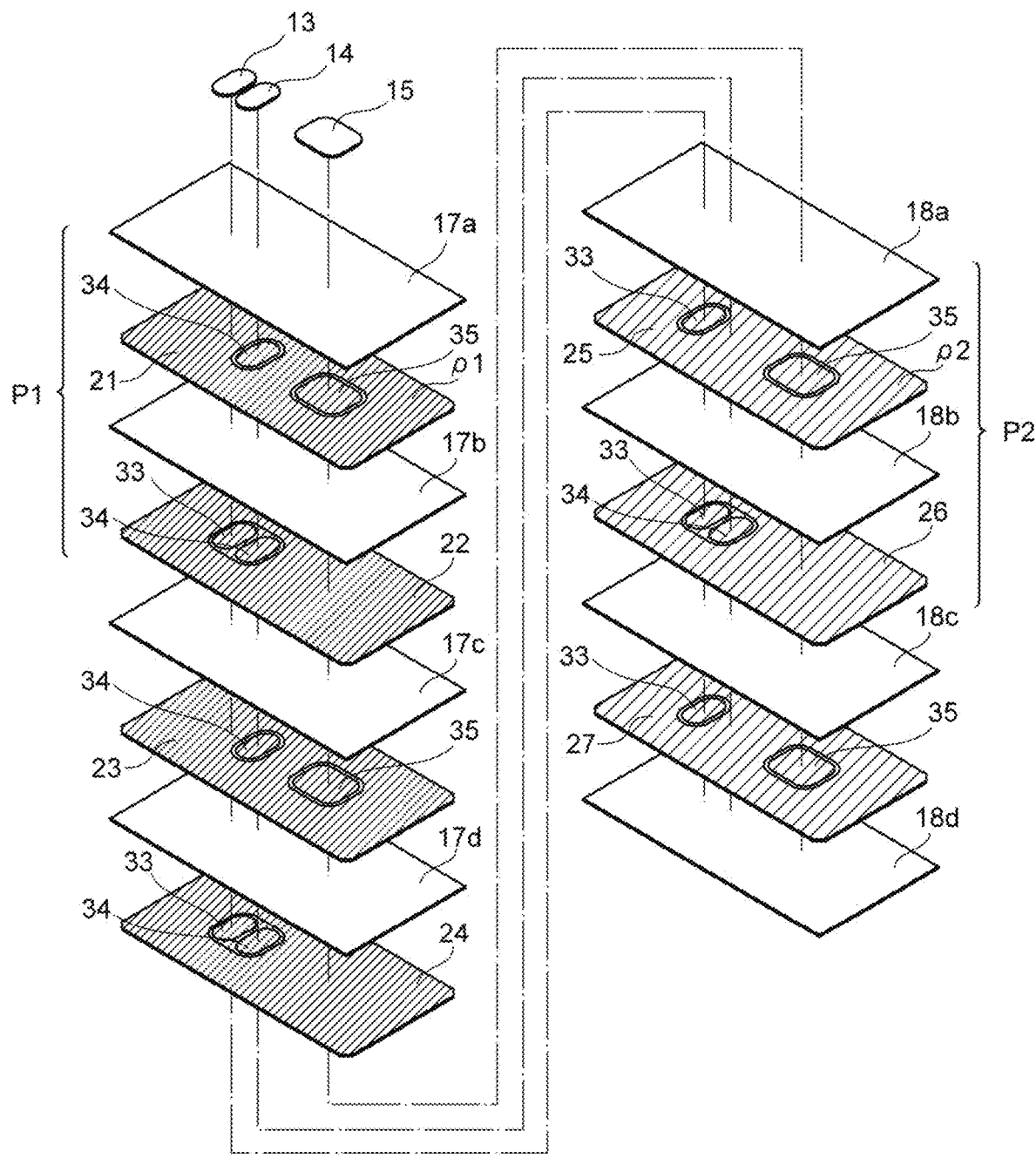
FIG. 7 is an exploded perspective view of a piezoelectric element used in a vibration device according to a modification example of the present embodiment.
Figure 8:
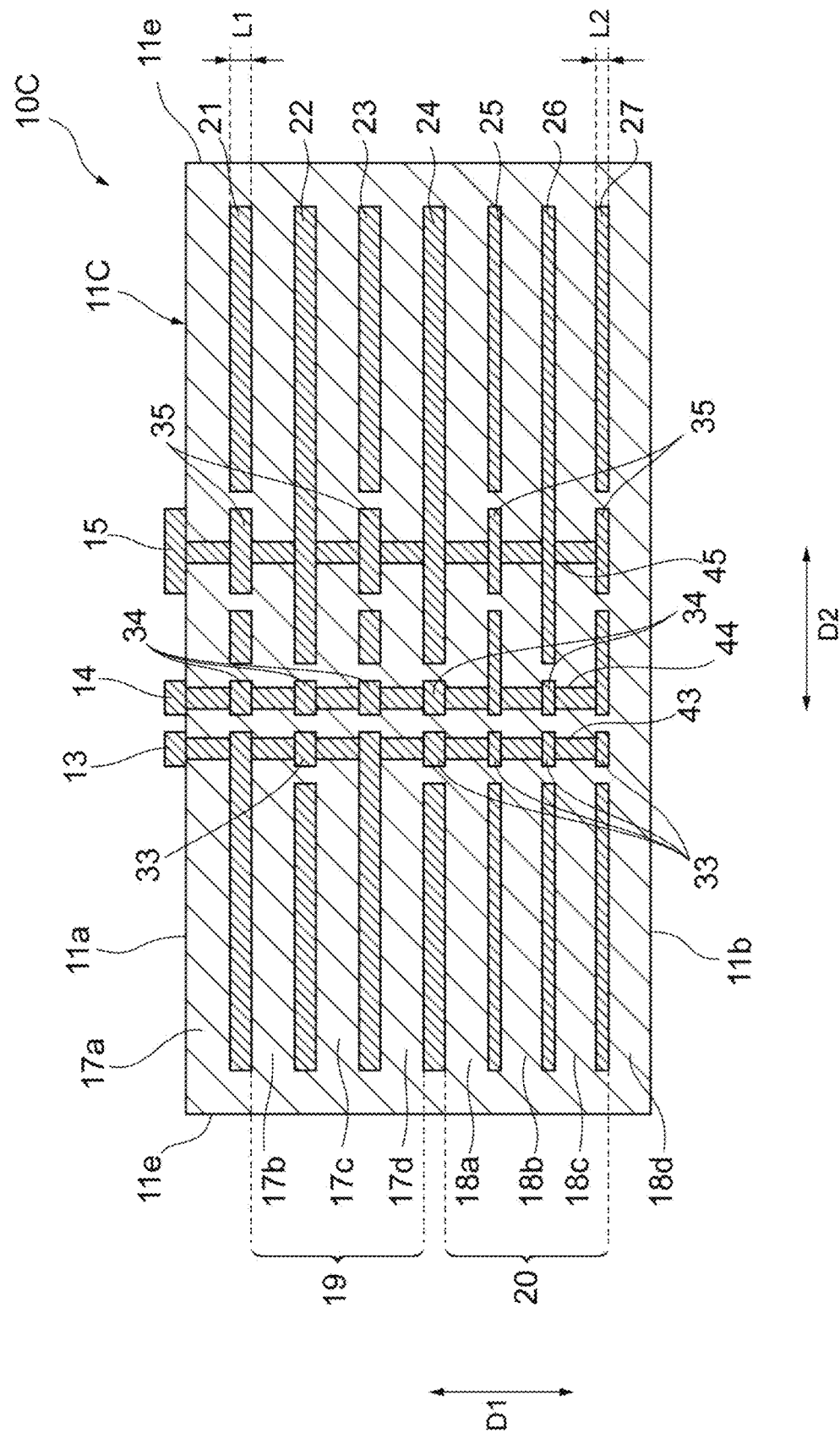
FIG. 8 is a cross-sectional view of the piezoelectric element used in the vibration device according to the modification example of the present embodiment.

The piezoelectric element 10 may be configured as illustrated in FIGS. 7 and 8. FIG. 7 is an exploded perspective view of a piezoelectric element used in a vibration device according to a modification example of the present embodiment. FIG. 8 is a cross-sectional view of the piezoelectric element used in the vibration device according to this modification example. In the piezoelectric element 10 in the embodiment described above and a piezoelectric element 10C in this modification example, the number of a plurality of piezoelectric layers, the number of internal electrodes, and the thickness, coverage, and volume density of internal electrodes for applying an electric field to the piezoelectric layers forming the second active region 20 are different.

In the piezoelectric element 10C used in the vibration device 1 according to this modification example, as illustrated in FIGS. 7 and 8, a plurality of piezoelectric layers 17a, 17b, 17c, 17d, 18a, 18b, 18c, and 18d are sequentially laminated in the first direction D1. The piezoelectric element 10C does not have the piezoelectric layers 18e and 18f. The piezoelectric layer 17a has the main surface 11a. The piezoelectric layer 18d has a main surface 11b.

The piezoelectric element 10C includes a plurality of internal electrodes 21, 22, 23, 24, 25, 26, and 27 in a piezoelectric body 11C. The piezoelectric element 10C does not include the internal electrodes 28 and 29. In this modification example, the number N1 of piezoelectric layers forming the first active region 19 and the number N2 of piezoelectric layers forming the second active region 20 are the same.

In the piezoelectric element 10C, the thicknesses of the internal electrodes 21, 22, 23, and 24 for applying an electric field to the first active region 19 are different from the thicknesses of the internal electrodes 25, 26, and 27 for applying an electric field to the second active region 20. When the internal electrodes 21, 22, 23, and 24 are the first internal electrodes, the internal electrodes 25, 26, and 27 are the second internal electrodes. The average of the thicknesses of the plurality of internal electrodes 21, 22, 23, and 24 for applying an electric field to the second active region 20 is smaller than the average of the thicknesses of the plurality of internal electrodes 25, 26, and 27 for applying an electric field to the first active region 19.

When the thickness of each of the internal electrodes 21, 22, 23, and 24 for applying an electric field to the first active region 19 is L1 and the thickness of each of the internal electrodes 25, 26, and 27 for applying an electric field to the second active region 20 is L2, L1>L2 is satisfied. That is, the thickness L2 of each of the internal electrodes 25, 26, and 27 is smaller than the thickness L1 of each of the internal electrodes 21, 22, 23, and 24. In this modification example, the thickness of each of the internal electrodes 21, 22, 23, and 24 is 20 μm, and the thickness of each of the internal electrodes 25, 26, and 27 is 1.5 μm.

In the piezoelectric element 10C, the coverages of the internal electrodes 21, 22, 23, and 24 for applying an electric field to the first active region 19 are different from the coverages of the internal electrodes 25, 26, and 27 for applying an electric field to the second active region 20. In the piezoelectric element 10C, the average of the coverages of the plurality of internal electrodes 25, 26, and 27 for applying an electric field to the second active region 20 is smaller than the average of the coverages of the plurality of internal electrodes 21, 22, 23, and 24 for applying an electric field to the first active region 19. Here, the "coverage" means the ratio of a portion covered with the internal electrode to the entire piezoelectric layer adjacent to the internal electrode when viewed from the first direction D1.

Figure 9:
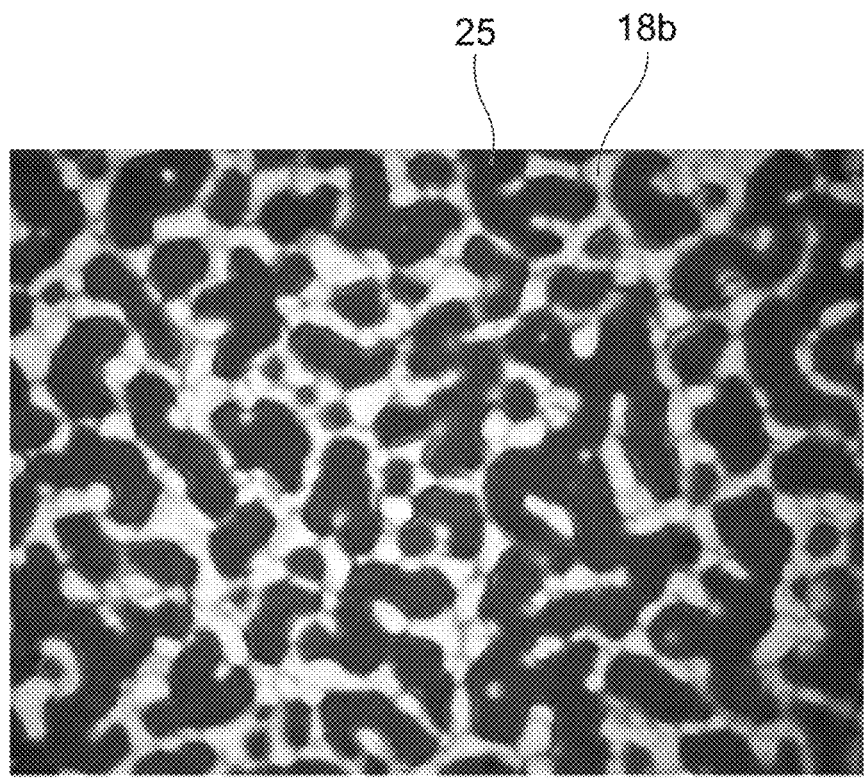
FIG. 9 is an enlarged view of an internal electrode in a piezoelectric layer of the vibration device according to the modification example of the present embodiment.
Figure 10:
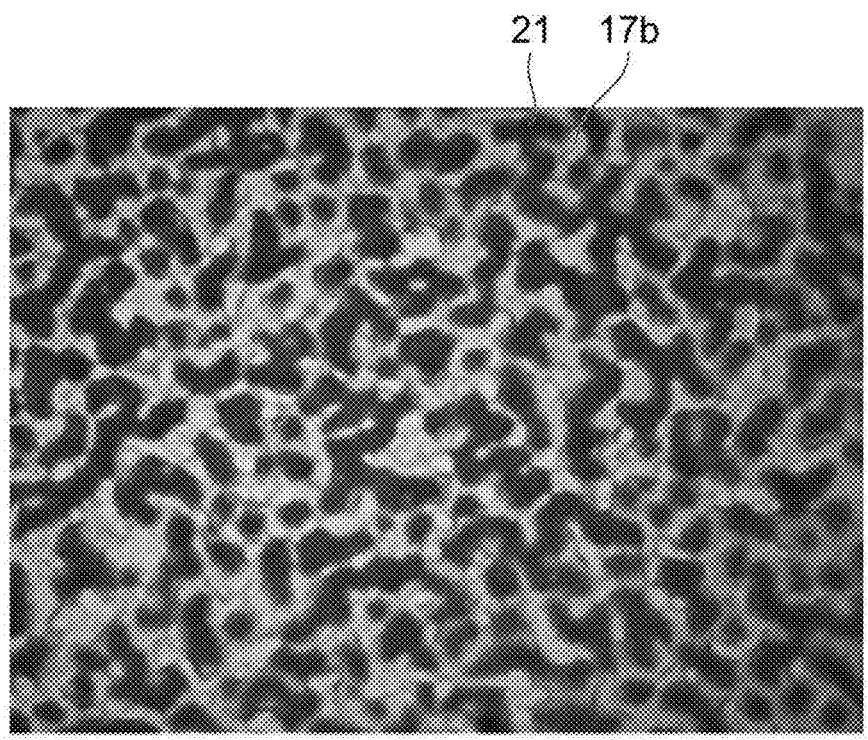
FIG. 10 is an enlarged view of an internal electrode in a piezoelectric layer of the vibration device according to the modification example of the present embodiment.

In this modification example, the coverage of each of the internal electrodes 21, 22, 23, and 24 is 60%, and the coverage of each of the internal electrodes 25, 26, and 27 is 70%. FIG. 9 shows the internal electrode 25 covering the piezoelectric layer 18b in an enlarged manner with a microscope. FIG. 10 is an enlarged view of the internal electrode 21 covering the piezoelectric layer 17b with a microscope.

In the piezoelectric element 10C, the volume densities of the internal electrodes 21, 22, 23, and 24 for applying an electric field to the first active region 19 are different from the volume densities of the internal electrodes 25, 26, and 27 for applying an electric field to the second active region 20. The average of the volume densities of the plurality of internal electrodes 25, 26, and 27 for applying an electric field to the second active region 20 is smaller than the average of the volume densities of the plurality of internal electrodes 21, 22, 23, and 24 for applying an electric field to the first active region 19. Here, the "volume density" means a volume occupied by the metal body per unit volume of each internal electrode.

When the volume density of each of the internal electrodes 21, 22, 23, and 24 for applying an electric field to the first active region 19 is $\rho 1$ and the volume density of each of the internal electrodes 25, 26, and 27 for applying an electric field to the second active region 20 is $\rho 2$, $\rho 1 > \rho 2$ is satisfied. That is, the volume density $\rho 2$ of each of the internal electrodes 25, 26, and 27 is smaller than the volume density $\rho 1$ of each of the internal electrodes 21, 22, 23, and 24.

In FIG. 7, the difference in density between the hatching of each of the internal electrodes 25, 26, and 27 and the hatching of each of the internal electrodes 21, 22, 23, and 24 indicates the difference in coverage and volume density $\rho 1$ and $\rho 2$. That is, this indicates that the internal electrodes 21, 22, 23, and 24, which are hatched more coarsely than the internal electrodes 25, 26, and 27, have smaller coverage and volume density than the internal electrodes 25, 26, and 27.

As described above, in this modification example, when the thickness of each of the internal electrodes 21, 22, 23, and 24 for applying an electric field to the first active region 19 is L1 and the thickness of each of the internal electrodes 25, 26, and 27 for applying an electric field to the second active region 20 is L2, L1>L2 is satisfied. In this case, the binding force generated by the internal electrodes 25, 26, and 27 can be reduced more than the binding force generated by the internal electrodes 21, 22, 23, and 24.

The coverage of each of the plurality of internal electrodes 25, 26, and 27 for applying an electric field to the second active region 20 is smaller than the coverage of each of the plurality of internal electrodes 21, 22, 23, and 24 for applying an electric field to the first active region 19. In this case, the binding force generated by the internal electrodes 25, 26, and 27 can be reduced more than the binding force generated by the internal electrodes 21, 22, 23, and 24.

When the volume density of each of the internal electrodes 21, 22, 23, and 24 for applying an electric field to the first active region 19 is $\rho 1$ and the volume density of each of the internal electrodes 25, 26, and 27 for applying an electric field to the second active region 20 is $\rho 2$, $\rho 1 > \rho 2$ is satisfied. In this case, the binding force generated by the internal electrodes 25, 26, and 27 can be reduced even more than the binding force generated by the internal electrodes 21, 22, 23, and 24.

In a case where the binding force generated by the internal electrodes 25, 26, and 27 is smaller than the binding force generated by the internal electrodes 21, 22, 23, and 24, even if the force generated in each of the piezoelectric layers 17b, 17c, and 17d forming the first active region 19 is the same as the force generated in each of the piezoelectric layers 18a, 18b, and 18c forming the second active region 20, the force F2 larger than the force F1 generated in the first active region 19 can be generated in the second active region 20. Therefore, in the piezoelectric element 10C, the force F2 larger than the force F1 generated in the first active region 19 can be generated in the second active region 20.

In the piezoelectric element 10C illustrated in FIGS. 7 and 8, the thickness of the piezoelectric element 10 in the first direction D1 can be smaller than that of the piezoelectric element 10 illustrated in FIG. 3.

In the piezoelectric element illustrated in FIG. 3, cracks are less likely to occur in the manufacturing process, such as pressing and sintering, and the electric field application process than in the piezoelectric element 10C illustrated in FIGS. 7 and 8.

The internal electrodes 21, 22, 23, and 24 for applying an electric field to the first active region 19 and the internal electrodes 25, 26, and 27 for applying an electric field to the second active region 20 are configured such that at least one of the thickness, the coverage, and the volume density is different. As described with reference to FIG. 3, the number N2 of piezoelectric layers forming the second active region 20 may be larger than the number N1 of piezoelectric layers forming the first active region 19. As described with reference to FIG. 6, the thickness T2 of each piezoelectric layer forming the second active region 20 may be smaller than the thickness T1 of each piezoelectric layer forming the first active region 19.

For example, even if the voltages applied to the external electrode 13 and the external electrode 14 are the same, a force larger than the force generated in the first active region can be generated in the second active region 20 by combining the plurality of configurations described above.

When viewed from the first direction D1, the area of the internal electrode for applying the electric field to the second active region 20 may be larger than the area of the internal electrode for applying the electric field to the first active region 19. In this case, an electric field larger than the electric field applied to the first active region 19 can be applied to the second active region 20.

The number of internal electrodes, the number of piezoelectric layers, and the number of external electrodes included in the piezoelectric elements 10, 10A, 10B, and 10C are not limited to the numbers disclosed in the above-described embodiment and modification example. The piezoelectric elements 10, 10A, 10B, and 10C and the vibration member 60 may have a square shape or a circular shape in a plan view.

The vibration member 60 may be a housing of an electronic apparatus or the like. The vibration member 60 may be a member different from the housing of the electronic apparatus or the like. In this case, the vibration member 60 may be attached to the housing by surface bonding.

As can be understood from the description of the above-described embodiment and modification example, this specification includes disclosure of the aspect described below.

(Note 1)

A bimorph type piezoelectric element including:
a first main surface and a second main surface facing each other;
a first active region disposed closer to the first main surface between the first and second main surfaces;
a second active region disposed closer to the second main surface than the first active region between the first and second main surfaces;
a first internal electrode that applies an electric field to the first active region; and
a second internal electrode that applies an electric field to the second active region,
in which each of the first active region and the second active region includes at least one piezoelectric layer, and
when a displacement amount of the first active region is X1 and a displacement amount of the second active region is X2, the piezoelectric element satisfies X1<X2.

REFERENCE SIGNS LIST

1: vibration device, 10, 10A, 10B, 10C: piezoelectric element, 11a, 11b: main surface, 19: first active region, 20: second active region, 60: vibration member, 21, 22, 23, 24, 25, 26, 27, 28, 29: internal electrode, 17a, 17b, 17c, 17d, 18a, 18b, 18c, 18d, 18e, 18f: piezoelectric layer.

The invention claimed is:

1. A vibration device, comprising:
a bimorph type piezoelectric element including a piezoelectric body in which a plurality of piezoelectric layers are laminated and form a first active region and a second active region, and having a first main surface and a second main surface facing each other; and
a vibration member bonded to the second main surface of the piezoelectric element,
wherein the first active region is disposed closer to the first main surface between the first and second main surfaces, and the second active region is disposed closer to the second main surface than the first active region between the first and second main surfaces and displaced in opposite directions to the first active region, and
when a force generated in the first active region is F1, a force generated in the second active region is F2, and a force by which the vibration member restrains the second active region is Fr, F2−F1≥Fr is satisfied.

2. A bimorph type piezoelectric element which has a first main surface and a second main surface facing each other and of which the second main surface is bonded to a vibration member to form a vibration device, comprising:
a piezoelectric body in which a plurality of piezoelectric layers are laminated and form a first active region and a second active region, the first active region disposed on the first main surface side between the first and second main surfaces, and the second active region disposed closer to the second main surface side than the first active region between the first and second main surfaces and displaced in opposite directions to the first active region;
a first internal electrode that applies an electric field to the first active region and is disposed inside the piezoelectric body; and
a second internal electrode that applies an electric field to the second active region and is disposed inside the piezoelectric body, wherein each of the first active region and the second active region includes at least one of the piezoelectric layers, and when a displacement amount of the first active region is X1 and a displacement amount of the second active region is X2, X1<X2 is satisfied.

3. The piezoelectric element according to claim 2, wherein, when the number of piezoelectric layers forming the first active region is N1 and the number of piezoelectric layers forming the second active region is N2, N1<N2 is satisfied.

4. The piezoelectric element according to claim 2, wherein, when a thickness of each of the piezoelectric layers forming the first active region is T1 and a thickness of each of the piezoelectric layers forming the second active region is T2, T1>T2 is satisfied.

5. The piezoelectric element according to claim 2, wherein a coverage of the second internal electrode is smaller than a coverage of the first internal electrode.

6. The piezoelectric element according to claim 2, wherein, when a thickness of the first internal electrode is L1 and a thickness of the second internal electrode is L2, L1>L2 is satisfied.

* * * * *